United States Patent
Chen et al.

(10) Patent No.: US 10,741,132 B2
(45) Date of Patent: Aug. 11, 2020

(54) SHIFT REGISTER CIRCUIT AND DRIVING METHOD THEREOF, GATE DRIVING CIRCUIT, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Mo Chen, Beijing (CN); Jinliang Liu, Beijing (CN); Wuxia Fu, Beijing (CN); Huanyu Li, Beijing (CN); Songmei Sun, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 177 days.

(21) Appl. No.: 15/746,753

(22) PCT Filed: Aug. 10, 2017

(86) PCT No.: PCT/CN2017/096787
§ 371 (c)(1),
(2) Date: Jan. 22, 2018

(87) PCT Pub. No.: WO2018/126687
PCT Pub. Date: Jul. 12, 2018

(65) Prior Publication Data
US 2019/0012970 A1   Jan. 10, 2019

(30) Foreign Application Priority Data
Jan. 5, 2017 (CN) .......................... 2017 1 0008449

(51) Int. Cl.
*G11C 19/00* (2006.01)
*G09G 3/36* (2006.01)
(Continued)

(52) U.S. Cl.
CPC ................. *G09G 3/36* (2013.01); *G06F 1/10* (2013.01); *G06F 1/26* (2013.01); *G09G 3/20* (2013.01);
(Continued)

(58) Field of Classification Search
None
See application file for complete search history.

(56) References Cited

U.S. PATENT DOCUMENTS 6,426,743 B1 * 7/2002 Yeo ...................... G09G 3/3677
345/100
7,233,308 B2 * 6/2007 Park ...................... G09G 3/3677
345/100
(Continued)

FOREIGN PATENT DOCUMENTS

CN      102682689 A      9/2012
CN      102750987 A      10/2012
(Continued)

OTHER PUBLICATIONS

Office Action received for Chinese Patent Application No. 201710008449.6, dated Jan. 23, 2018, 15 pages (8 pages of English Translation and 7 pages of Office Action).
(Continued)

*Primary Examiner* — Tuan T Lam
(74) *Attorney, Agent, or Firm* — Womble Bond Dickinson (US) LLP

(57) ABSTRACT

A shift register circuit is disclosed that includes an input control circuit configured to set a first node at a first potential in response to an active pulse signal from a signal input
(Continued)

terminal, an output control circuit configured to supply a clock signal from a first clock signal terminal to a signal output terminal in response to the first node being at the first potential, the first potential being less than a potential of the active pulse signal and greater than or equal to a potential for maintaining operation of the output control circuit, and a reset circuit configured to supply a reference voltage from a reference voltage terminal to the first node and the signal output terminal in response to a reset signal.

17 Claims, 4 Drawing Sheets

(51) Int. Cl.

| | |
|---|---|
| *G11C 19/28* | (2006.01) |
| *G09G 3/20* | (2006.01) |
| *G06F 1/10* | (2006.01) |
| *G06F 1/26* | (2006.01) |
| G09G 3/3266 | (2016.01) |

(52) U.S. Cl.
CPC ........... *G11C 19/28* (2013.01); *G09G 3/3266* (2013.01); *G09G 3/3674* (2013.01); *G09G 3/3677* (2013.01); *G09G 2310/0283* (2013.01); *G09G 2310/0286* (2013.01); *G11C 19/287* (2013.01)

(56) References Cited

U.S. PATENT DOCUMENTS

| | | | | |
|---|---|---|---|---|
| 8,250,788 | B2* | 8/2012 | Scheve | D06F 73/00 138/118 |
| 9,536,466 | B2* | 1/2017 | Nie | G09G 3/2096 |
| 9,729,146 | B2* | 8/2017 | Ahn | H03K 17/284 |
| 2007/0290982 | A1 | 12/2007 | Kim et al. | |
| 2008/0080661 | A1* | 4/2008 | Tobita | G11C 19/28 377/78 |
| 2008/0187089 | A1* | 8/2008 | Miyayama | G11C 19/28 377/79 |
| 2010/0177082 | A1* | 7/2010 | Joo | G09G 3/3677 345/211 |
| 2011/0116592 | A1* | 5/2011 | Tsai | G11C 19/184 377/79 |
| 2012/0269315 | A1 | 10/2012 | Jang et al. | |
| 2014/0064438 | A1 | 3/2014 | Wu et al. | |
| 2014/0064439 | A1* | 3/2014 | Qing | G11C 19/28 377/75 |
| 2014/0176410 | A1* | 6/2014 | Ma | G09G 3/3622 345/92 |
| 2015/0102735 | A1* | 4/2015 | Kuo | G09G 3/3677 315/161 |
| 2016/0018844 | A1 | 1/2016 | Sasaki et al. | |
| 2016/0064098 | A1 | 3/2016 | Han et al. | |
| 2017/0003804 | A1* | 1/2017 | Sung | G06F 3/0412 |
| 2018/0277043 | A1* | 9/2018 | Li | G11C 19/28 |
| 2019/0005910 | A1* | 1/2019 | Zhao | G09G 3/3677 |

FOREIGN PATENT DOCUMENTS

| | | |
|---|---|---|
| CN | 202771779 U | 3/2013 |
| CN | 103050106 A | 4/2013 |
| CN | 203773916 U | 8/2014 |
| CN | 105144301 A | 12/2015 |
| CN | 106205522 A | 12/2016 |
| CN | 106531117 A | 3/2017 |

OTHER PUBLICATIONS

International Search Report received for PCT Patent Application No. PCT/CN2017/096787, dated Nov. 9, 2017, 11 pages (3 pages of English Translation and 8 pages of Original Document).

* cited by examiner

SHIFT REGISTER CIRCUIT AND DRIVING METHOD THEREOF, GATE DRIVING CIRCUIT, AND DISPLAY DEVICE

CROSS-REFERENCE TO RELATED APPLICATIONS

The present application is the U.S. national phase entry of PCT/CN2017/096787, with an international filing date of Aug. 10, 2017, which claims the benefit of Chinese Patent Application No. 201710008449.6, filed on Jan. 5, 2017, the entire disclosures of which are incorporated herein by reference.

The disclosure relates to the field of display technology, and more particularly to a shift register circuit and a driving method thereof, a gate driving circuit and a display device.

BACKGROUND

A shift register may operate as a gate driving circuit of a display device to sequentially supply a gate scan signal to the gate lines to turn on the transistors in the rows of pixels, thus allowing writing of data signals into the pixels.

In order to fully turn on the transistors, the high level of the gate scan signal typically needs to reach 25 V or more. Due to the self-boosting effect of the storage capacitor in the shift register, the voltage at some internal nodes of the shift register may even be higher, for example, more than a factor of two above the high level of the gate-scan signal (above 50 V). Such a high voltage causes a large change in the characteristics of the transistors connected to these internal nodes, resulting in a threshold voltage drift. If the display device operates under such a condition for a long time, the shift register may become unstable, leading to a degraded gate scanning signal.

SUMMARY

It would be advantageous to provide a shift register circuit and a gate driving circuit that may alleviate, mitigate or eliminate one or more of the problems described above.

According to a first aspect of the present disclosure, a shift register circuit is provided comprising: an input control circuit connected to a signal input terminal, a reference voltage terminal and a first node, the input control circuit being configured to set the first node at a first potential in response to an active pulse signal from the signal input terminal; an output control circuit connected to the first node, a first clock signal terminal, and a signal output terminal, the output control circuit being configured to provide a clock signal from the first clock signal terminal to the signal output terminal in response to the first node being at the first potential, the first potential being less than a potential of the active pulse signal and greater than or equal to a potential for maintaining operation of the output control circuit; and a reset circuit connected to a reset signal terminal, the reference voltage terminal, the first node, and the signal output terminal, the reset circuit being configured to supply a reference voltage from the reference voltage terminal to the first node and the signal output terminal in response to a reset signal from the reset signal terminal.

In some embodiments, the input control circuit comprises: a first transistor having a gate and a first electrode that are connected to the signal input terminal and a second electrode connected to the first node; and a second transistor having a gate connected to the signal input terminal, a first electrode connected to the reference voltage terminal, and a second electrode connected to the first node.

In some embodiments, the output control circuit comprises: a third transistor having a gate connected to the first node, a first electrode connected to the first clock signal terminal, and a second electrode connected to the signal output terminal; and a capacitor connected between the first node and the signal output terminal.

In some embodiments, the reset circuit comprises: a fourth transistor having a gate connected to the reset signal terminal, a first electrode connected to the reference voltage terminal, and a second electrode connected to the first node; and a fifth transistor having a gate connected to the reset signal terminal, a first electrode connected to the reference voltage terminal, and a second electrode connected to the signal output terminal.

In some embodiments, the shift register circuit further comprises a pull-down control circuit connected to a second clock signal terminal, the reference voltage terminal, the first node, and a second node. The pull-down control circuit is configured to supply the reference voltage from the reference voltage terminal to the second node in response to the first node being at the first potential, and to supply the reference voltage from the reference voltage terminal to the first node in response to the second node being supplied with a clock signal having an active potential from the second clock signal terminal.

In some embodiments, the pull-down control circuit comprises: a sixth transistor having a gate and a first electrode that are connected to the second clock signal terminal and a second electrode connected to a third node; a seventh transistor having a gate connected to the third node, a first electrode connected to the second clock signal terminal, and a second electrode connected to the second node; an eighth transistor having a gate connected to the first node, a first electrode connected to the reference voltage terminal, and a second electrode connected to the third node; a ninth transistor having a gate connected to the first node, a first electrode connected to the reference voltage terminal, and a second electrode connected to the second node; and a tenth transistor having a gate connected to the second node, a first electrode connected to the reference voltage terminal, and a second electrode connected to the first node.

In some embodiments, the shift register circuit further comprises a first pull-down circuit connected to the second node, the reference voltage terminal, and the signal output terminal. The first pull-down circuit is configured to supply the reference voltage from the reference voltage terminal to the signal output terminal in response to the second node being supplied with the clock signal having the active potential from the second clock signal terminal.

In some embodiments, the first pull-down circuit comprises an eleventh transistor having a gate connected to the second node, a first electrode connected to the reference voltage terminal, and a second electrode connected to the signal output terminal.

In some embodiments, the shift register circuit further comprises a second pull-down circuit connected to the second clock signal terminal, the reference voltage terminal, and the signal output terminal. The second pull-down circuit is configured to supply the reference voltage from the reference voltage terminal to the signal output terminal in response to the second clock signal having the active potential from the second clock signal terminal.

In some embodiments, the second pull-down circuit comprises a twelfth transistor having a gate connected to the second clock signal terminal, a first electrode connected to the reference voltage terminal, and a second electrode connected to the signal output terminal.

According to another aspect of the present disclosure, a gate driving circuit is provided comprising a plurality of cascaded shift register circuits as described above. Except for a first one and a last one of the shift register circuits, the signal output terminal of each of the shift register circuits is connected to both the signal input terminal of a next one of the shift register circuits and the reset signal terminal of a previous one of the shift register circuits. The signal output terminal of the first one of the shift register circuits is connected to the signal input terminal of a second one of the shift register circuits. The signal output terminal of the last one of the shift register circuits is connected to the reset signal terminal of a previous one of the shift register circuits.

According to yet another aspect of the present disclosure, a display device is provided comprising the gate driving circuit as described above.

According to still yet another aspect of the present disclosure, a method is provided for driving the shift register circuit as described above. The method comprises: setting, in a first time period, the first node at the first potential in response to the active pulse signal from the signal input terminal; supplying, in a second time period, the clock signal from the first clock signal terminal to the signal output terminal in response to the first node being at the first potential; and supplying, in a third time period, the reference voltage from the reference voltage terminal to the first node and the signal output terminal in response to the reset signal from the reset signal terminal.

In some embodiments, the method further comprises: supplying, in the first time period and the second time period, the reference voltage from the reference voltage terminal to a second node in response to the first node being at the first potential; and supplying, in the third time period, the reference voltage from the reference voltage terminal to the first node in response to the second node being supplied with a clock signal having an active potential from a second clock signal terminal.

In some embodiments, the method further comprises: in the third time period, supplying the reference voltage from the reference voltage terminal to the signal output terminal in response to the second node being supplied with the clock signal having the active potential from the second clock signal terminal and supplying the reference voltage from the reference voltage terminal to the signal output terminal in response to a second clock signal having the active potential from the second clock signal terminal.

These and other aspects of the present disclosure will be apparent from and elucidated with reference to the embodiment(s) described hereinafter.

BRIEF DESCRIPTION OF THE DRAWINGS

Further details, features and advantages of the disclosure are disclosed in the following description of exemplary embodiments in connection with the accompanying drawings, in which.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure are described in detail below with reference to the accompanying drawings.

Figure 1:
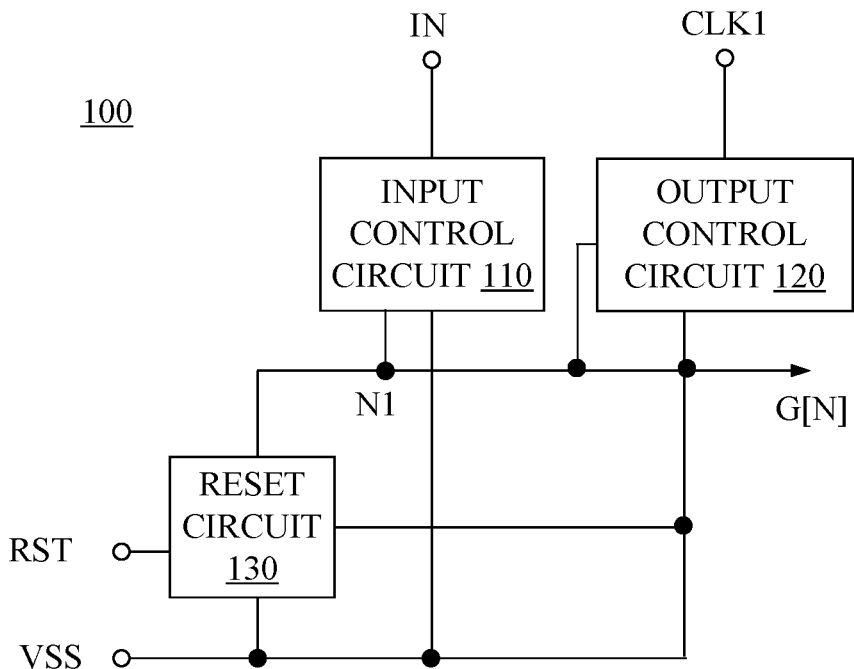
FIG. 1 is a block diagram of a shift register circuit according to an embodiment of the present disclosure.

FIG. 1 is a block diagram of a shift register circuit 100 according to an embodiment of the present disclosure. Referring to FIG. 1, the shift register 100 includes an input control circuit 110, an output control circuit 120, and a reset circuit 130.

The input control circuit 110 is connected to a signal input terminal IN, a reference voltage terminal VSS, and a first node N1. The input control circuit 110 is configured to set the first node N1 at a first potential in response to an active pulse signal from the signal input terminal IN. The term active pulse signal, as used herein, refers to a signal having such a potential as to enable the input control circuit 110 to operate.

The output control circuit 120 is connected to the first node N1, a first clock signal terminal CLK1 and a signal output terminal G[N]. The output control circuit 120 is configured to supply a clock signal from the first clock signal terminal CLK1 to the signal output terminal G[N] in response to the first node N1 being at the first potential. As will be described below, the first potential is smaller than a potential of the active pulse signal and greater than or equal to a potential for maintaining operation of the output control circuit 120.

The reset circuit 130 is connected to a reset signal terminal RST, the reference voltage terminal VSS, the first node N1 and the signal output terminal G[N]. The reset circuit 130 is configured to supply the reference voltage from the reference voltage terminal VSS to the first node N1 and the signal output terminal G[N] in response to the reset signal from the reset signal terminal RST.

Figure 2:
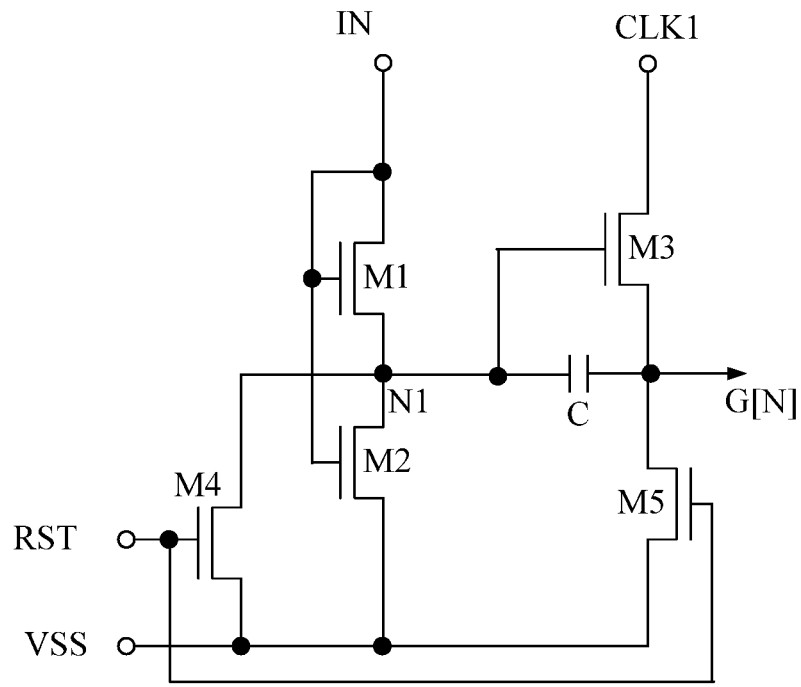
FIG. 2 is an exemplary circuit diagram of the shift register circuit shown in FIG. 1.

In this embodiment, when the shift register circuit 100 is in operation, the potential of the internal node N1 is adjusted to the first potential that is less than the potential of the active pulse signal. Therefore, the potential of the internal node N1 is lowered in operation. This may be advantageous in that various problems caused by the high potential of the internal node of the shift register circuit may be avoided, such as the drift of the threshold voltage of the transistor connected to the internal node, the instability of the gate scan signal generated by the shift register circuit, and so on. FIG. 2 is an exemplary circuit diagram of the shift register circuit 100 shown in FIG. 1.

The input control circuit 110 includes a first transistor M1 and a second transistor M2. The first transistor M1 has a gate and a first electrode that are connected to the signal input terminal IN, and a second electrode connected to the first node N1. The second transistor M2 has a gate connected to the signal input terminal IN, a first electrode connected to the reference voltage terminal VSS, and a second electrode connected to the first node N1. In operation, the turned-on first and second transistors M1 and M2 exhibit a resistance divider effect such that the potential at the first node N1 is pulled down to a first potential (denoted as Vp) which is less than the potential Vh of the active pulse signal from the signal input terminal IN, i.e., Vh>Vp.

The output control single 120 includes a third transistor M3 and a capacitor C. The third transistor M3 has a gate connected to the first node N1, a first electrode connected to the first clock signal terminal CLK1, and a second electrode connected to the signal output terminal G[N]. The capacitor C is connected between the first node N1 and the signal output terminal G[N]. As the operation of the output control circuit 120 (the third transistor M3 in this example) is controlled by the potential at the first node N1, the first potential Vp should be greater than or equal to the potential Vo for maintaining the operation of the output control circuit 120 (the third transistor M3), i.e., Vp≥Vo, so as to allow for the normal operation of the output control circuit 120. In operation, when the first node N1 is at the first potential Vp, the third transistor M3 transfers the clock signal from the first clock signal terminal CLK1 to the signal output terminal G[N] and the capacitance C is charged with a voltage across the first node N1 and the signal output G[N].

The reset circuit 130 includes a fourth transistor M4 and a fifth transistor M5. The fourth transistor M4 has a gate connected to the reset signal terminal RST, a first electrode connected to the reference voltage terminal VSS, and a second electrode connected to the first node N1. The fifth transistor M5 has a gate connected to the reset signal terminal RST, a first electrode connected to the reference voltage terminal VSS, and a second electrode connected to the signal output terminal G[N]. In operation, the fourth transistor M4 transfers the reference voltage from the reference voltage terminal VSS to the first node N1 in response to the reset signal from the reset signal terminal RST, and the fifth transistor M5 transfers the reference voltage from the reference voltage terminal VSS to the signal output terminal G[N] in response to the reset signal from the reset signal terminal RST.

Figure 3:
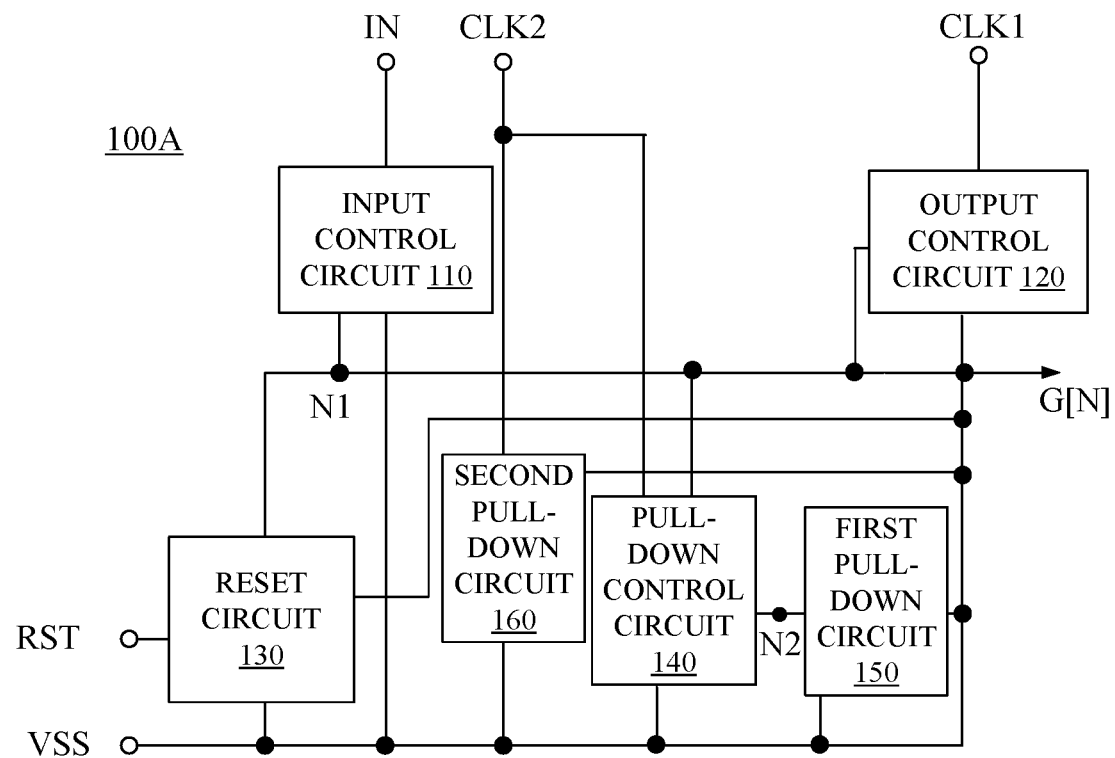
FIG. 3 is a block diagram of a shift register circuit according to an embodiment of the present disclosure.

FIG. 3 is a block diagram of a shift register circuit 100A according to an embodiment of the present disclosure. Referring to FIG. 3, compared with the shift register 100 shown in FIG. 1, the shift register 100A further includes a pull-down control circuit 140, a first pull-down circuit 150, and a second pull-down circuit 160. The configurations of the input control circuit 110, the output control circuit 120, and the reset circuit 130 are similar to those described above with reference to FIG. 1, and thus will not be repeated here.

The pull-down control circuit 140 is connected to a second clock signal terminal CLK2, the reference voltage terminal VSS, the first node N1, and a second node N2. The pull-down control circuit 140 is configured to supply the reference voltage from the reference voltage terminal VSS to the second node N2 in response to the first node N1 being at the first potential Vp. The pull-down control circuit 140 is further configured to supply the reference voltage from the reference voltage terminal VSS to the first node N1 in response to the second node N2 being supplied with a clock signal having the active potential from the second clock signal terminal CLK2. The term active potential, as used herein, refers to a potential that enables the pull-down control circuit 140 to operate.

The first pull-down circuit 150 is connected to the second node N2, the reference voltage terminal VSS and the signal output terminal G[N]. The first pull-down circuit 150 is configured to supply the reference voltage from the reference voltage terminal VSS to the signal output terminal G[N] in response to the second node N2 being supplied with the clock signal having the active potential from the second clock signal terminal CLK2. With the first pull-down circuit 150, the signal output by the signal output terminal G[N] can be kept at a stable reference voltage, thus improving the stability of the output signal.

The second pull-down circuit 160 is connected to the second clock signal terminal CLK2, the reference voltage terminal VSS and the signal output terminal G[N]. The second pull-down circuit 160 is configured to supply a reference voltage from the reference voltage terminal VSS to the signal output terminal G[N] in response to a second clock signal having an active potential from the second clock signal terminal CLK2. With the second pull-down circuit 160, the signal output from the signal output terminal G[N] can be kept at a stable reference voltage, thus improving the stability of the output signal.

Figure 4:
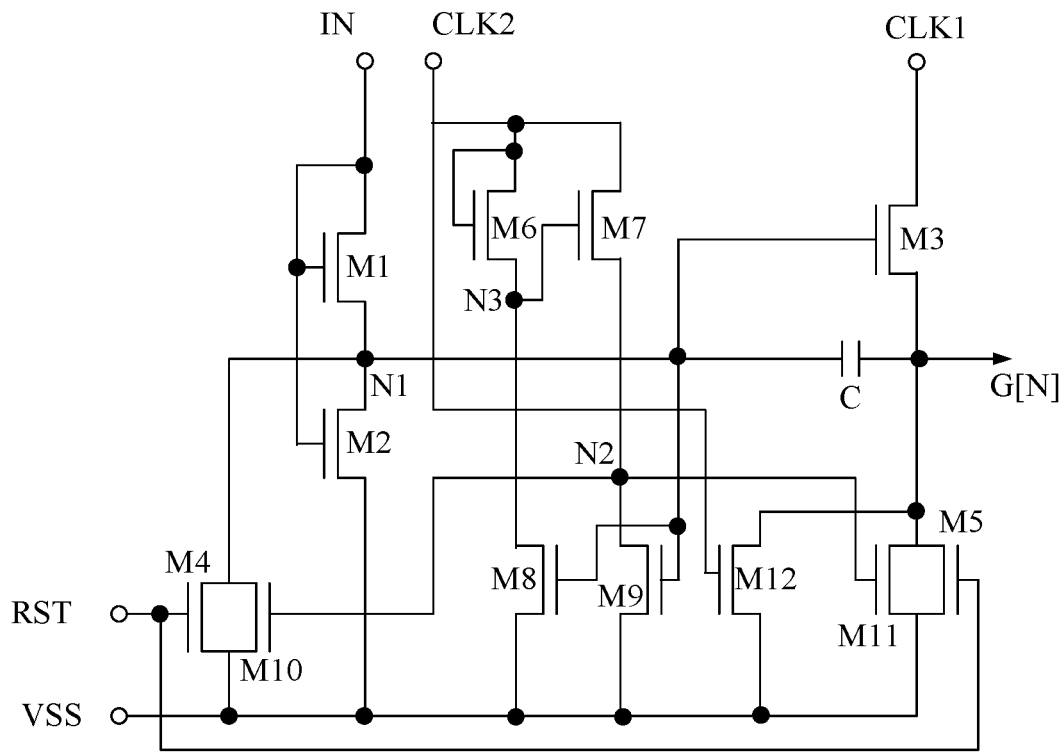
FIG. 4 is an exemplary circuit diagram of the shift register circuit shown in FIG. 3.

FIG. 4 is an exemplary circuit diagram of the shift register circuit 100A shown in FIG. 3.

The configurations of the input control circuit 110, the output control circuit 120, and the reset circuit 130 are similar to those described above with reference to FIG. 2, and thus are not repeated here.

The pull-down control circuit 140 includes a sixth transistor M6, a seventh transistor M7, an eighth transistor M8, a ninth transistor M9, and a tenth transistor M10. The sixth transistor M6 has a gate and a first electrode that are connected to the second clock signal terminal CLK2 and a second electrode connected to the third node N3. The seventh transistor M7 has a gate connected to the third node N3, a first electrode connected to the second clock signal terminal CLK2, and a second electrode connected to the second node N2. The eighth transistor M8 has a gate connected to the first node N1, a first electrode connected to the reference voltage terminal VSS, and a second electrode connected to the third node N3. The ninth transistor M9 has a gate connected to the first node N1, a first electrode connected to the reference voltage terminal VSS, and a second electrode connected to the second node N2. The tenth transistor M10 has a gate connected to the second node N2, a first electrode connected to the reference voltage terminal VSS, and a second electrode connected to the first node N1. In operation, the sixth transistor M6 transfers a clock signal having an active potential from the second clock signal terminal CLK2 to the third node N3 in response to the clock signal from the second clock signal terminal CLK2, the seventh transistor M7 transfers the clock signal having the active potential from the second clock signal terminal CLK2 to the second node N2 in response to the third node N3 being supplied with the clock signal from the second clock signal terminal CLK2, the eighth transistor M8 transfers the reference voltage from the reference voltage terminal VSS to the third node N3 in response to the first node N1 being at the potential Vp, the ninth transistor M9 transfers the reference voltage from the reference voltage terminal VSS to the second node N2 in response to the first node N1 being at the first potential Vp, and the tenth transistor M10 transfers the reference voltage from the reference voltage terminal VSS to the first node N1 in response to the second node N2 being supplied with the clock signal having the active potential from the second clock signal terminal CLK2.

The first pull-down circuit 150 includes an eleventh transistor M11. The eleventh transistor M11 has a gate connected to the second node N2, a first electrode connected to the reference voltage terminal VSS, and a second electrode connected to the signal output terminal G[N]. Specifically, the eleventh transistor M11 supplies the reference voltage of the reference voltage terminal VSS to the signal output terminal G[N] when the second node N2 is at the clock signal potential of the second clock signal terminal CLK2.

The second pull-down circuit 160 includes a twelfth transistor M12. The twelfth transistor M12 has a gate connected to the second clock signal terminal CLK2, a first electrode connected to the reference voltage terminal VSS, and a second electrode connected to the signal output terminal G[N]. In operation, the twelfth transistor M12 supplies the reference voltage from the reference voltage terminal VSS to the signal output terminal G[N] in response to the clock signal having the active potential from the second clock signal terminal CLK2.

Figure 5:
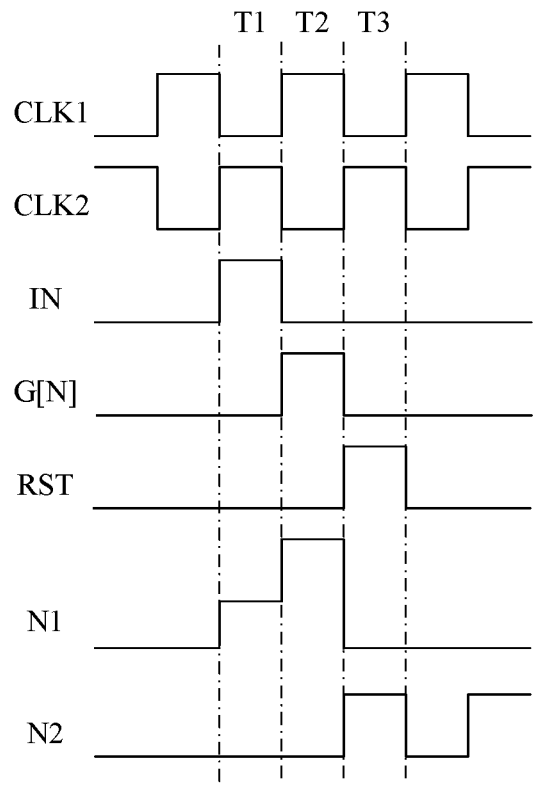
FIG. 5 is a timing diagram of the shift register circuit shown in FIG. 4.

FIG. 5 is a timing chart of the shift register circuit shown in FIG. 4. The operation of the shift register circuit is described in conjunction with FIGS. 4 and 5. In the following, the high level is indicated by 1 and the low level by 0.

In phase T1, IN=1, CLK1=0, CLK2=1, RST=0. Since the signal input terminal IN is supplied with the active pulse signal Vh, the first transistor M1 and the second transistor M2 are turned on. Due to the resistance divider effect of the first transistor M1 and the second transistor M2, the potential at the first node N1 is set to the first potential Vp. As discussed above, the first potential Vp is greater than or equal to the potential Vo for maintaining the operation of the output control circuit 20 and less than the potential Vh of the active pulse signal, i.e., Vh>Vp>Vo. Since the first node N1 is at the first potential Vp, the ninth transistor M9 is turned on, and the reference voltage from the reference voltage terminal VSS is transferred to the second node N2.

In phase T2, IN=0, CLK1=1, CLK2=0, RST=0. Since the first node N1 is at the first potential Vp, the third transistor M3 is turned on and the clock signal (in this example, the high level signal Vh) from the first clock signal terminal CLK1 is supplied to the signal output terminal G[N], so that the signal output terminal G[N] outputs the high level signal Vh. At the same time, the potential at the first node N1 is pulled up to Vp+Vh due to the self-boosting effect of the capacitor C. Since the first node N1 is at the first potential Vp+Vh, the ninth transistor M9 is turned on and the reference voltage from the reference voltage terminal VSS is transferred to the second node N2. The potential Vp+Vh at the first node N1 is now less than 2*Vh as compared to the prior art in which the potential at the internal node may be twice the output high level (e.g., 2*Vh). Therefore, the potential at the internal node is lowered in the shift register circuit according to the embodiment of the present disclosure.

In phase T3, IN=0, CLK1=0, CLK2=1, RST=1. Since RST=1, the fourth transistor M4 and the fifth transistor M5 are turned on and the reference voltage from the reference voltage terminal VSS, which in this example has a low level, is supplied to the first node N1 and the signal output terminal G[N], so that the potential at the first node N1 is pulled low and the signal output G[N] outputs a low level signal. Since CLK2=1, the sixth transistor M6 is turned on and the high-level signal from the second clock signal terminal CLK2 is supplied to the third node N3, so that the seventh transistor M7 is turned on and the potential at the second node N2 is pulled high. The tenth transistor M10 and the eleventh transistor M11 are then turned on and the reference voltage from the reference voltage terminal VSS is supplied to the first node N1 and the signal output terminal G[N], ensuring that the first node N1 is at a low level and the signal output terminal G[N] outputs a low level signal. In addition, since CLK2=1, the twelfth transistor M12 is turned on, and the reference voltage from the reference voltage terminal VSS is supplied to the signal output terminal G[N].

Phases T1-T3 may be repeated as a whole at an interval so that the shift register circuit outputs a gate scan signal at the interval via the signal output terminal G[N].

In the above embodiments, the respective transistors are illustrated as N-type transistors although P-type transistors are possible. In the case of a P-type transistor, the gate-on voltage has a low level, and the gate-off voltage has a high level. In various embodiments, each transistor may typically be a thin film transistor that is fabricated such that its first and second electrodes are used interchangeably. Other embodiments are also contemplated.

Figure 6:
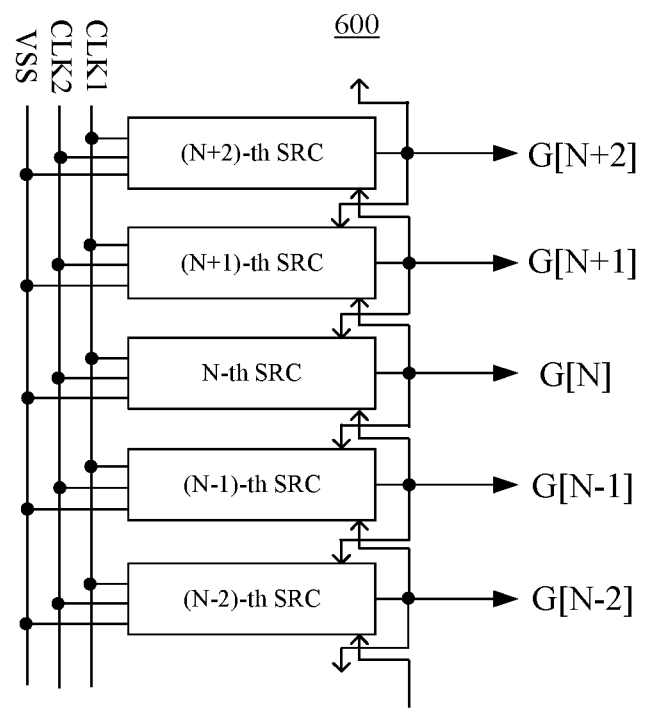
FIG. 6 is a block diagram of a gate driving circuit according to an embodiment of the present disclosure.

FIG. 6 is a block diagram of a gate driving circuit 600 according to an embodiment of the present disclosure. Referring to FIG. 6, the gate driving circuit 600 includes a plurality of cascaded shift register circuits (SRCs). These shift register circuits together form a shift register that may operate as a gate driving circuit.

For ease of illustration, only five shift registers are shown in FIG. 6, which are the (N−2)-th SRC, the (N−1)-th SRC, the N-th SRC, the (N+1)-th SRC and the (N+2)-th SRC, respectively. Each of these shift register circuits may be the shift register circuit 100 or 100A described above with reference to FIGS. 1 to 4.

As shown in FIG. 6, the signal output terminal of each of the shift register circuits, except for the first shift register circuit and the last shift register circuit, is connected to the signal input terminal of the next shift register circuit and the reset signal terminal of the previous shift register circuit. In this example, the signal output terminal G[N] of the N-th shift register circuit inputs not only the active pulse signal to the signal input terminal IN of the (N+1)-th shift register circuit but also the reset signal to the reset signal terminal RST of the (N−1)-th shift register circuit. In addition, the signal output terminal of the first shift register circuit is connected to the input terminal of the second shift register circuit, and the signal output terminal of the last shift register circuit is connected to the reset signal terminal of the previous shift register circuit.

Figure 7:
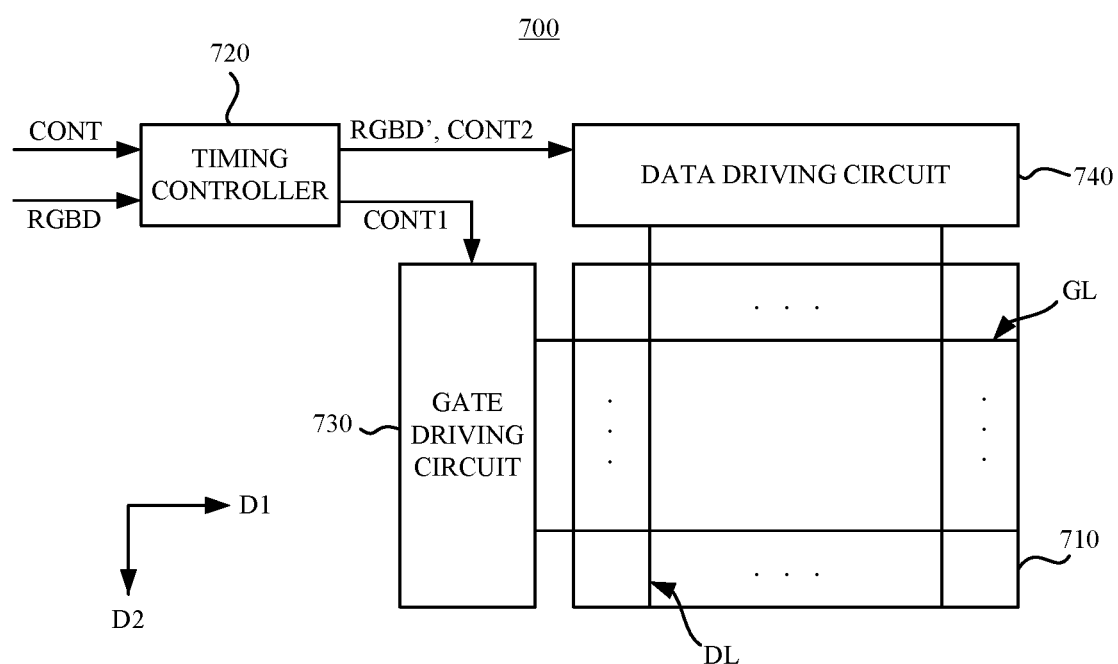
FIG. 7 is a block diagram of a display device according to an embodiment of the present disclosure.

FIG. 7 is a block diagram of a display device 700 according to an embodiment of the present disclosure. Referring to FIG. 7, the display device 700 includes a display panel 710, a timing controller 720, a gate driving circuit 730 and a data driving circuit 740. The gate driving circuit 730 may be the gate driving circuit 600 described above with respect to FIG. 6.

The display panel 710 is connected to a plurality of gate lines GL and a plurality of data lines DL. The display panel 710 displays an image having a plurality of grayscales based on output image data RGBD'. The gate lines GL may extend in a first direction D1 and the data lines DL may extend in a second direction D2 that intersects (e.g., is substantially perpendicular to) the first direction D1. The display panel 710 may include a plurality of pixels (not shown) arranged in a matrix. Each pixel may be electrically connected to a corresponding one of the gate lines GL and a corresponding one of the data lines DL. The display panel 710 may be a liquid crystal display panel, an organic light emitting diode (OLED) display panel, or other suitable type of display panel.

The timing controller 720 controls the operation of the display panel 710, the gate driving circuit 730, and the data driving circuit 740. The timing controller 720 receives input image data RGBD and an input control signal CONT from an external device (for example, a host). The input image data RGBD may include a plurality of input pixel data for a plurality of pixels. Each input pixel data may include red, green, and blue grayscale data R, G, and B for a corresponding one of the plurality of pixels. The input control signal CONT may include a main clock signal, a data enable signal, a vertical synchronization signal, a horizontal synchronization signal, and the like. The timing controller 720 generates output image data RGBD', a first control signal CONT1, and a second control signal CONT2 based on the input image data RGBD and the input control signal CONT.

The gate driving circuit 730 receives the first control signal CONT1 from the timing controller 720. The gate driving circuit 730 generates a plurality of gate signals for driving the gate lines GL based on the first control signals CONT1. The gate driving circuit 730 may sequentially apply the plurality of gate signals to the gate lines GL.

The data driving circuit 740 receives the second control signal CONT2 and the output image data RGBD' from the timing controller 720. The data driving circuit 740 generates a plurality of data voltages (e.g., analog data voltages) based on the second control signal CONT2 and the output image data RGBD' (e.g., digital image data). The data driving circuit 740 may apply the plurality of data voltages to the data lines DL.

In some exemplary embodiments, the gate driving circuit 730 and/or the data driving circuit 740 may be disposed (e.g., mounted directly) on the display panel 710 or may be connected to the display panel 710 by means of, for example, a Tape Carrier Package (TCP). In some embodiments, the gate driving circuit 730 and/or the data driving circuit 740 may be integrated in the display panel 710.

It is apparent that various modifications and variations to the present disclosure can be made by those skilled in the art without departing from the spirit and scope of the disclosure. Thus, if these modifications and variations to the present disclosure fall within the scope of the claims of the present disclosure and equivalents thereof, the disclosure is also intended to encompass these modifications and variations.

What is claimed is:

1. A shift register circuit, comprising:
an input control circuit connected to a signal input terminal, a reference voltage terminal and a first node, the input control circuit being configured to set the first node at a first potential in response to an active pulse signal from the signal input terminal;
an output control circuit connected to the first node, a first clock signal terminal, and a signal output terminal, the output control circuit being configured to provide a clock signal from the first clock signal terminal to the signal output terminal in response to the first node being at the first potential, the first potential being less than a potential of the active pulse signal and greater than or equal to a potential for maintaining operation of the output control circuit; and
a reset circuit connected to a reset signal terminal, the reference voltage terminal, the first node, and the signal output terminal, the reset circuit being configured to supply a reference voltage from the reference voltage terminal to the first node and the signal output terminal in response to a reset signal from the reset signal terminal,
wherein the input control circuit comprises;
a first transistor having a gate and a first electrode that are connected to the signal input terminal and a second electrode connected to the first node; and
a second transistor having a gate connected to the signal input terminal, a first electrode connected to the reference voltage terminal, and a second electrode connected to the first node.

2. The shift register circuit of claim 1, wherein the output control circuit comprises:
a third transistor having a gate connected to the first node, a first electrode connected to the first clock signal terminal, and a second electrode connected to the signal output terminal; and
a capacitor connected between the first node and the signal output terminal.

3. The shift register circuit of claim 1, wherein the reset circuit comprises:
a fourth transistor having a gate connected to the reset signal terminal, a first electrode connected to the reference voltage terminal, and a second electrode connected to the first node; and
a fifth transistor having a gate connected to the reset signal terminal, a first electrode connected to the reference voltage terminal, and a second electrode connected to the signal output terminal.

4. The shift register circuit of claim 1, further comprising a pull-down control circuit connected to a second clock signal terminal, the reference voltage terminal, the first node, and a second node, wherein the pull-down control circuit is configured to supply the reference voltage from the reference voltage terminal to the second node in response to the first node being at the first potential, and to supply the reference voltage from the reference voltage terminal to the first node in response to the second node being supplied with a clock signal having an active potential from the second clock signal terminal.

5. The shift register circuit of claim 4, wherein the pull-down control circuit comprises:

a sixth transistor having a gate and a first electrode that are connected to the second clock signal terminal and a second electrode connected to a third node;

a seventh transistor having a gate connected to the third node, a first electrode connected to the second clock signal terminal, and a second electrode connected to the second node;

an eighth transistor having a gate connected to the first node, a first electrode connected to the reference voltage terminal, and a second electrode connected to the third node;

a ninth transistor having a gate connected to the first node, a first electrode connected to the reference voltage terminal, and a second electrode connected to the second node; and a tenth transistor having a gate connected to the second node, a first electrode connected to the reference voltage terminal, and a second electrode connected to the first node.

6. The shift register circuit of claim 4, further comprising a first pull-down circuit connected to the second node, the reference voltage terminal, and the signal output terminal, wherein the first pull-down circuit is configured to supply the reference voltage from the reference voltage terminal to the signal output terminal in response to the second node being supplied with the clock signal having the active potential from the second clock signal terminal.

7. The shift register circuit of claim 6, wherein the first pull-down circuit comprises an eleventh transistor having a gate connected to the second node, a first electrode connected to the reference voltage terminal, and a second electrode connected to the signal output terminal.

8. The shift register circuit of claim 6, further comprising a second pull-down circuit connected to the second clock signal terminal, the reference voltage terminal, and the signal output terminal, wherein the second pull-down circuit is configured to supply the reference voltage from the reference voltage terminal to the signal output terminal in response to the second clock signal having the active potential from the second clock signal terminal.

9. The shift register circuit of claim 8, wherein the second pull-down circuit comprises a twelfth transistor having a gate connected to the second clock signal terminal, a first electrode connected to the reference voltage terminal, and a second electrode connected to the signal output terminal.

10. A gate driving circuit comprising a plurality of cascaded shift register circuits as claimed in claim 1, wherein:

except for a first one and a last one of the shift register circuits, the signal output terminal of each of the shift register circuits is connected to both the signal input terminal of a next one of the shift register circuits and the reset signal terminal of a previous one of the shift register circuits;

the signal output terminal of the first one of the shift register circuits is connected to the signal input terminal of a second one of the shift register circuits; and the signal output terminal of the last one of the shift register circuits is connected to the reset signal terminal of a previous one of the shift register circuits.

11. A display device comprising the gate driving circuit as claimed in claim 10.

12. A method of driving the shift register circuit as claimed in claim 1, the method comprising:

setting, in a first time period, the first node at the first potential in response to the active pulse signal from the signal input terminal;

supplying, in a second time period, the clock signal from the first clock signal terminal to the signal output terminal in response to the first node being at the first potential; and supplying, in a third time period, the reference voltage from the reference voltage terminal to the first node and the signal output terminal in response to the reset signal from the reset signal terminal.

13. The method of claim 12, further comprising:

supplying, in the first time period and the second time period, the reference voltage from the reference voltage terminal to a second node in response to the first node being at the first potential; and supplying, in the third time period, the reference voltage from the reference voltage terminal to the first node in response to the second node being supplied with a clock signal having an active potential from a second clock signal terminal.

14. The method of claim 13, further comprising:

in the third time period, supplying the reference voltage from the reference voltage terminal to the signal output terminal in response to the second node being supplied with the clock signal having the active potential from the second clock signal terminal and supplying the reference voltage from the reference voltage terminal to the signal output terminal in response to a second clock signal having the active potential from the second clock signal terminal.

15. The shift register circuit of claim 1, further comprising a pull-down control circuit connected to a second clock signal terminal, the reference voltage terminal, the first node, and a second node, wherein the pull-down control circuit is configured to supply the reference voltage from the reference voltage terminal to the second node in response to the first node being at the first potential, and to supply the reference voltage from the reference voltage terminal to the first node in response to the second node being supplied with a clock signal having an active potential from the second clock signal terminal.

16. The shift register circuit of claim 2, further comprising a pull-down control circuit connected to a second clock signal terminal, the reference voltage terminal, the first node, and a second node, wherein the pull-down control circuit is configured to supply the reference voltage from the reference voltage terminal to the second node in response to the first node being at the first potential, and to supply the reference voltage from the reference voltage terminal to the first node in response to the second node being supplied with a clock signal having an active potential from the second clock signal terminal.

17. The shift register circuit of claim 3, further comprising a pull-down control circuit connected to a second clock signal terminal, the reference voltage terminal, the first node, and a second node, wherein the pull-down control circuit is configured to supply the reference voltage from the reference voltage terminal to the second node in response to the first node being at the first potential, and to supply the reference voltage from the reference voltage terminal to the first node in response to the second node being supplied with a clock signal having an active potential from the second clock signal terminal.

* * * * *